United States Patent
Chung et al.

(10) Patent No.: US 8,487,680 B1
(45) Date of Patent: Jul. 16, 2013

(54) FULL-DIGITAL CLOCK CORRECTION CIRCUIT AND METHOD THEREOF

(75) Inventors: Ching-Che Chung, Chiayi County (TW); Sung-En Shen, New Taipei (TW)

(73) Assignee: National Chung Cheng University, Chiayi County (TW)

( * ) Notice: Subject to any disclaimer, the term of this patent is extended or adjusted under 35 U.S.C. 154(b) by 0 days.

(21) Appl. No.: 13/453,094

(22) Filed: Apr. 23, 2012

(30) Foreign Application Priority Data

Jan. 20, 2012 (TW) .............................. 101102418 A

(51) Int. Cl.
*H03K 3/017* (2006.01)
(52) U.S. Cl.
USPC .......................................... 327/175; 327/172
(58) Field of Classification Search
USPC .......................................................... 327/175
See application file for complete search history.

(56) References Cited

U.S. PATENT DOCUMENTS

| | | | | |
|---|---|---|---|---|
| 5,614,855 | A * | 3/1997 | Lee et al. ...................... | 327/158 |
| 6,677,792 | B2 * | 1/2004 | Kwak ........................... | 327/158 |
| 6,765,421 | B2 * | 7/2004 | Brox et al. .................... | 327/175 |
| 7,046,059 | B2 * | 5/2006 | Kwak ........................... | 327/158 |
| 7,057,431 | B2 * | 6/2006 | Kwak ........................... | 327/158 |
| 7,142,026 | B2 * | 11/2006 | Kwak ........................... | 327/158 |
| 7,250,801 | B2 * | 7/2007 | Minzoni ........................ | 327/175 |
| 7,671,647 | B2 * | 3/2010 | Gomm et al. ................. | 327/158 |
| 7,750,703 | B2 * | 7/2010 | Yun et al. ....................... | 327/175 |
| 7,940,103 | B2 * | 5/2011 | Satoh et al. .................... | 327/175 |
| 7,999,589 | B2 * | 8/2011 | Lin ................................ | 327/175 |
| 8,339,167 | B2 * | 12/2012 | Gomm et al. ................. | 327/158 |
| 2004/0066873 | A1 * | 4/2004 | Cho et al. ...................... | 375/376 |
| 2006/0091921 | A1 * | 5/2006 | Park et al. ..................... | 327/175 |
| 2007/0013423 | A1 * | 1/2007 | Lee ................................ | 327/175 |
| 2007/0247203 | A1 * | 10/2007 | Cho et al. ...................... | 327/175 |
| 2008/0001643 | A1 * | 1/2008 | Lee ................................ | 327/175 |
| 2008/0204099 | A1 * | 8/2008 | Hur ................................ | 327/175 |
| 2010/0060334 | A1 * | 3/2010 | Abe et al. ...................... | 327/158 |
| 2010/0117702 | A1 * | 5/2010 | Jang et al. ..................... | 327/175 |
| 2010/0207675 | A1 * | 8/2010 | Miyano ......................... | 327/175 |
| 2010/0225372 | A1 * | 9/2010 | Satoh et al. .................... | 327/175 |
| 2010/0237917 | A1 * | 9/2010 | Monma ......................... | 327/158 |
| 2011/0001527 | A1 * | 1/2011 | Lee ................................ | 327/158 |

(Continued)

OTHER PUBLICATIONS

Ching-Che Chung, Duo Sheng, and Sung-En Shen; A Wide-Range All-Digital Duty-Cycle Corrector with Output Clock Phase Alignment in 65 nm CMOS Technology; IEICE Electronics Express, vol. 8, No. 15, Aug. 10, 2011, pp. 1245-1251.

*Primary Examiner* — Long Nguyen
*Assistant Examiner* — Patrick Chen
(74) *Attorney, Agent, or Firm* — Rosenberg, Klein & Lee

(57) ABSTRACT

The present invention provides a full-digital clock duty cycle correction circuit and a method thereof. The circuit comprises a sampling unit, a duty cycle correcting module, and a phase-lock module. The duty cycle correcting module produces a first clock signal according to an input clock signal. The phase-lock module produces a second clock signal according to the first clock signal and is used for aligning the positive edges of the clock signals. The duty cycle correcting module adjusts the pulse width of the first clock signal according to the clock signals. In addition, after the pulse width is adjusted, the positive edges of the clock signals are re-aligned. When the pulse width is not equal to zero, the pulse width is re-adjusted and the positive edges are re-aligned until the pulse widths of the clock signals are identical. Finally, the second clock signal is outputted and thus producing a clock signal having 50% duty cycle.

8 Claims, 6 Drawing Sheets

U.S. PATENT DOCUMENTS

| | | | |
|---|---|---|---|
| 2011/0074479 A1* | 3/2011 | Yun et al. | 327/158 |
| 2011/0128059 A1* | 6/2011 | Kim et al. | 327/175 |
| 2011/0204948 A1* | 8/2011 | Satoh et al. | 327/175 |
| 2011/0248756 A1* | 10/2011 | Abe | 327/158 |
| 2012/0124409 A1* | 5/2012 | Miyano | 713/503 |
| 2012/0182054 A1* | 7/2012 | Sabapathy et al. | 327/172 |
| 2012/0268171 A1* | 10/2012 | Willey et al. | 327/117 |

* cited by examiner

FULL-DIGITAL CLOCK CORRECTION CIRCUIT AND METHOD THEREOF

FIELD OF THE INVENTION

The present invention relates generally to a duty cycle correction device and a method thereof, and particularly to a full-digital clock duty cycle correction circuit and a method thereof.

BACKGROUND OF THE INVENTION

Digital devices are prevalent nowadays. While spreading, exchanging, and processing digital information using digital devices, it is necessary to operate in coordination with clocks in circuits for processing digital signals or even the data attached in digital signals. For example, the central processing unit (CPU) in computer architecture should operate in coordination with the clock signal for driving the various digital circuits inside the CPU to operate in coordination with the clock signal for accessing data, processing data, or controlling hardware. In addition, in mobile devices, it is also required to use clocks for triggering transmission of digital information; synchronization in clocks is required before correct data access between digital devices. In the process of clock synchronization described above, the adopted technologies can be categorized into frequency division and frequency multiplication for giving, though different frequencies, harmonic and synchronized clocks, which would facilitate coordination of digital data processing among different digital circuits.

In order to accelerate extraction of digital data, digital devices need to use the positive and negative edges of clock signals, which require the duty cycle of the clock signals to be 50%. Nonetheless, owing to imbalanced charge and discharge time via transistors and variations in process, temperature, and operating voltage, the duty cycle of clock signals in digital devices is not equal to 50%. Thereby, it is not possible to adopt the positive and negative edges of clock signals for accelerating digital data extraction. Besides, errors may occur during data acquisition. For solving the problems described above, it is required to use a correction circuit for duty cycle to change the pulse width so that the duty cycle of the clock signals can recover to 50%.

As compared to an analog duty-cycle corrector (DCC), a full-digital DCC does not use the voltage control method, and thus it is less influenced by the leakage current of transistors especially in advanced CMOS processes. In addition, the all-digital DCC owns the advantages of fast lock-in time and has a wide range of duty cycle correction. Thereby, general semiconductor digital devices, for example, memory devices, use extensively digital DCC to correct the duty cycle of clock signals. The digital DCC according to the prior art adopts a time to digital converter (TDC) to quantize the period of the reference clock and then generates a half-cycle delay signal via a delay circuit for generating a clock signal with 50% duty cycle. Nevertheless, while adopting the time to digital converter architecture with a wide range of clock frequency, because the TDC accuracy has to be maintained and the operating frequency has to be wide, the overall circuit area occupied by the digital DCC will increase significantly.

Furthermore, by using the TDC architecture, the half-cycle delay circuit has to be included, which makes the tuning accuracy of the digital DCC become twice the accuracy of the TDC, and hence limiting the accuracy of the digital DCC and resulting in excessive error in duty cycle.

Accordingly, the present invention provides a full-digital clock correction circuit and a method thereof, which improve the problems using the TDC architecture according to the prior art. In addition, the accuracy in clock duty cycle correction is improved, and the frequency range and the duty cycle range of the supported clock signals are widened as well.

SUMMARY

An objective of the present invention is to provide a full-digital clock duty cycle correction circuit and a method thereof, which improve duty-cycle correction accuracy and provide a wider frequency operating range. In addition, the present invention also supports a wider duty-cycle range of the input clock and reduces the chip area.

The present invention provides a full-digital clock duty cycle correction circuit, which comprises a sampling unit, a duty cycle correcting module, and a phase-lock module. The duty cycle correcting module is connected electrically to the sampling unit; the phase-lock module is connected electrically to the sampling unit and the duty cycle correcting module. The sampling unit receives an input clock signal and transmits it to the duty cycle correcting module for producing a first clock signal CLK_X correspondingly. The phase-lock module produces a second clock signal CLK_Y according to the first clock signal CLK_X. Besides, the second clock signal CLK_Y is the inverse of the first clock signal CLK_X and is delayed in phase by a phase tuning unit. The phase-lock module detects the phase difference between the positive edges of the first and second clock signals CLK_X, CLK_Y selected by the sampling unit and aligns the positive edges of the first and second clock signals CLK_X, CLK_Y. The duty cycle correcting module compares the pulse width difference between the first and second clock signals CLK_X, CLK_Y for adjusting the pulse width of the first clock signal CLK_X. When the pulse width of the first clock signal CLK_X is changed, the pulse width of the second clock signal CLK_Y will be changed accordingly. In addition, each time after the duty cycle correcting module adjusts the pulse width of the first clock signal CLK_X, the phase-lock module needs to re-align the positive edges of the first and second clock signals CLK_X, CLK_Y. Then, when the pulse width difference between the first and second clock signals CLK_X, CLK_Y is not equal to zero, the duty cycle correcting module re-adjusts the pulse width of the first clock signal CLK_X for the phase-lock module to re-align the positive edges of the first and second clock signals CLK_X, CLK_Y until the first and second clock signals CLK_X, CLK_Y have identical pulse widths and the phase difference between the positive edges of the first and second clock signals CLK_X, CLK_Y is zero. Afterwards, the sampling unit selects an input clock signal CLK_in and an output clock signal CLK_out to the phase detecting unit for the phase-lock module to re-align the positive edges of the output clock signal CLK_out and the input clock signal CLK_in until the phase difference between the positive edges of the output clock signal CLK_out and the input clock signal CLK_in is zero. Thereby, the positive edge of the output clock signal CLK_out is aligned with the input clock signal CLK_in; the duty cycle of the output clock signal CLK_out is also corrected to 50%.

After the phase-lock module aligns the positive edges of the first and second clock signals CLK_X, CLK_Y for the first time, if the duty cycle correcting module detects that the pulse width of the first clock signal CLK_X is greater than the second clock signal CLK_Y, namely, the duty cycle of the input clock signal is greater than 50%, the sampling unit selects the inversed input clock signal and transmits it to the duty cycle correcting module for ensuring that the duty cycle of the clock signal input to the duty cycle tuning unit is always less than 50%. At this moment, the output clock signal is changed to the inversed second clock signal CLK_Y.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
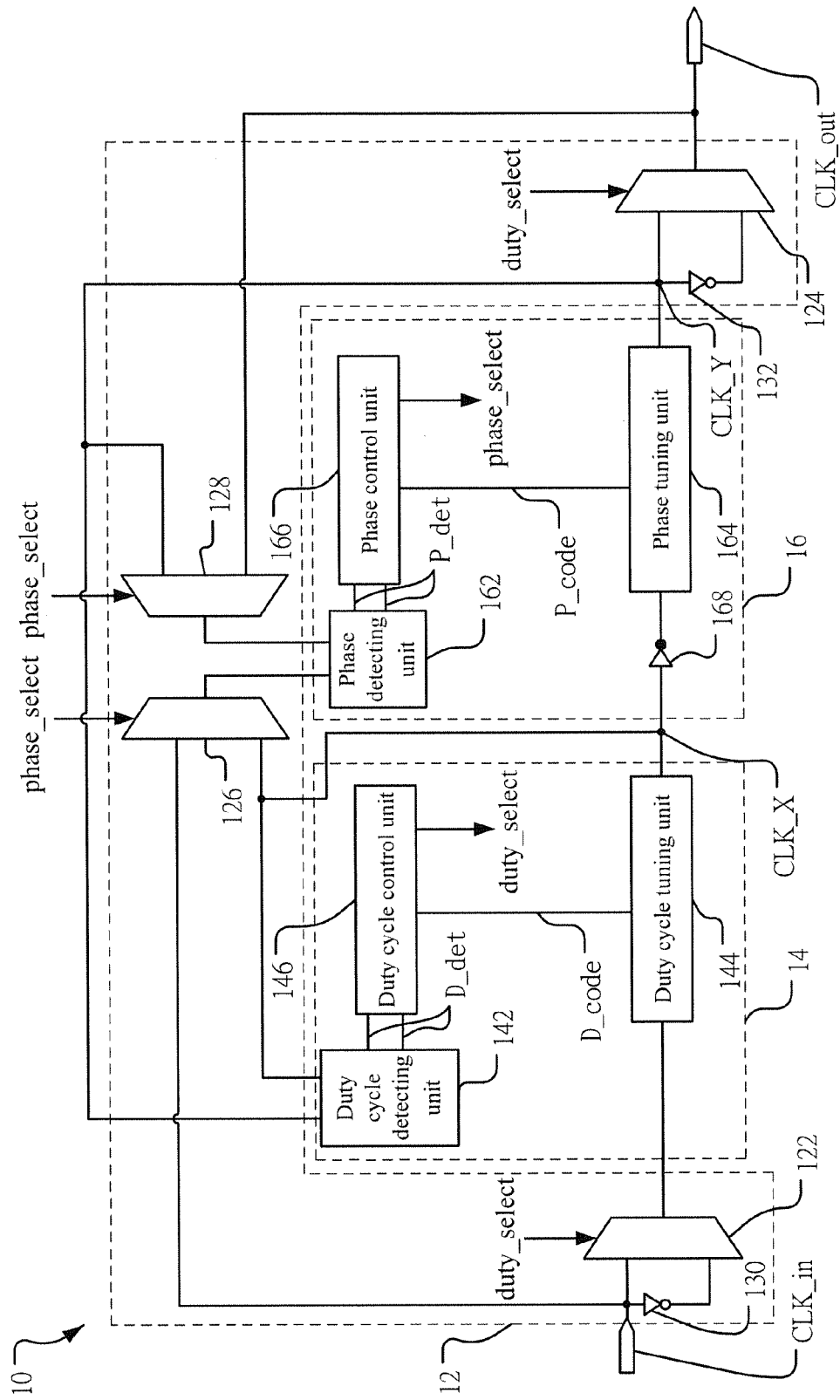
FIG. 1 shows a circuit diagram according to an embodiment of the present invention.

FIG. 1 shows a circuit diagram according to an embodiment of the present invention. As shown in the figure, the full-digital clock duty cycle correction circuit 10 according to the present invention comprises a sampling unit 12, a duty cycle correcting module 14, and a phase-lock module 16. In addition, the sampling unit 12 further comprises a first multiplexer 122, a second multiplexer 124, a third multiplexer 126, a fourth multiplexer 128, a first inverter 130, and a second inverter 132. The duty cycle correction module 14 further comprises a duty cycle detecting unit 142, a duty cycle tuning unit 144, and a duty cycle control unit 146. Besides, the phase-lock module 16 further comprises a phase detecting unit 162, a phase tuning unit 164, a phase control unit 166, and a third inverter 168.

The first multiplexer 122 is connected electrically to the input clock signal CLK_in. The first inverter 130 is connected electrically to the third multiplexer 126, the duty cycle tuning unit 144, and the duty cycle control unit 146. The second multiplexer 124 is connected electrically to the fourth multiplexer 128, the second inverter 132, the duty cycle detecting unit 142, the duty cycle control unit 146, the phase tuning unit 164, the input of the fourth multiplexer 128, and the output clock signal CLK_out. The third multiplexer 126 is connected electrically to the duty cycle detecting unit 142, the duty cycle tuning unit 144, the phase detecting unit 162, the phase tuning unit 164, and the phase control unit 166. The fourth multiplexer 128 is connected electrically to the duty cycle detecting unit 142, the phase detecting unit 162, the phase tuning unit 164, and the phase control unit 166.

The sampling unit 12 is connected electrically to the phase-lock module 16 and the duty cycle correcting module 14. The sampling unit 12 receives an input clock signal CLK_in and transmits it to the duty cycle correcting module 14 for producing a first clock signal CLK_X correspondingly. The phase-lock module 16 receives the first clock signal CLK_X and produces correspondingly a second clock signal CLK_Y, which is the inverse of the first clock signal CLK_X and phase delayed by the phase tuning unit 164.

The duty cycle correcting module 14 detects the pulse width difference between the first and second clock signals CLK_X, CLK_Y and adjusts the pulse width of the first clock signal CLK_X according to the pulse-width difference. The duty cycle detecting unit 142 produces a duty cycle detecting signal D_det according to the difference between the pulse widths of the first and second clock signals CLK_X, CLK_Y. The duty cycle control unit 146 produces a duty cycle control code D_code according to the duty cycle detecting signal D_det and transmits the duty cycle control code D_code to the duty cycle correcting unit 144. The duty cycle tuning unit 144 receives the first clock signal CLK_X, and adjusts the pulse width of the first clock signal CLK_X according to the duty cycle control code D_code. When the pulse width of the first clock signal CLK_X is changed, the pulse width of the second clock signal CLK_Y is changed accordingly. In addition, after the duty cycle control unit 146 adjusts the pulse widths described above, the duty cycle control unit 146 locks the duty cycle correcting unit 144. The duty cycle control unit 146 will control the first and second multiplexers 122, 124 via a duty cycle select signal duty_select according to whether the duty cycle of the input signal is greater or less than 50%.

The phase-lock module 16 detects and compensates the phase difference between the positive edges of the first and second clock signals CLK_X, CLK_Y for aligning them. The phase detecting unit 162 detects the phase difference of positive edges for producing a phase detecting signal P_det and transmitting it to the phase control unit 166. The phase control unit 166 produces a phase control code P_code according to the phase detecting signal P_det and transmits it to the phase tuning unit 164. The phase tuning unit 164 receives the inverse signal of the first clock signal CLK_X produced by the third inverter 168, and tunes and aligns the phases of the positive edges of the first and second clock signals CLK_X, CLK_Y according to the phase control code P_code. Besides, after the phases of the first and second clock signals CLK_X, CLK_Y are aligned, the phase control unit 166 further locks the phase tuning unit 164. After the duty cycle is corrected, the phase control unit 166 further controls the third and fourth multiplexer 126, 128 via a phase select signal phase_select for selecting the input clock signal CLK_in and the output clock signal CLK_out to the phase detecting unit 162 for the phase-lock module 16 to re-align the positive edges of the output and input clock signals CLK_out, CLK_in until the phase difference between the positive edges of the output and input clock signals CLK_out, CLK_in is zero. Then, the positive edge of the output clock signal CLK_out is aligned with the input clock signal CLK_in, and the duty cycle thereof is corrected back to 50%.

Every time the duty cycle correcting module 14 adjusts the pulse width of the first clock signal CLK_X, the phase-lock module 16 needs to re-align the positive edges of the first and second clock signals CLK_X, CLK_Y. When the pulse-width difference is not equal to zero, the duty cycle correcting module 14 re-adjusts the pulse width of the first clock signal CLK_X for the phase-lock module 16 to re-align the positive edges of the first and second clock signals CLK_X, CLK_Y until the first and second clock signals CLK_X, CLK_Y have identical pulse widths and the phase difference between the positive edges of the first and second clock signals CLK_X, CLK_Y is zero. Then, when the duty cycle of the input clock signal CLK_in is less than 50%, the second clock signal CLK_Y is outputted as the output clock CLK_out. On the other hand, when the duty cycle of the input clock signal CLK_in is greater than 50%, the output is changed to the inverse of the second clock signal CLK_Y. After the full-digital clock duty cycle correction circuit 10 is locked, the duty-cycle of the output clock signal CLK_out will be 50%.

Figure 2A:
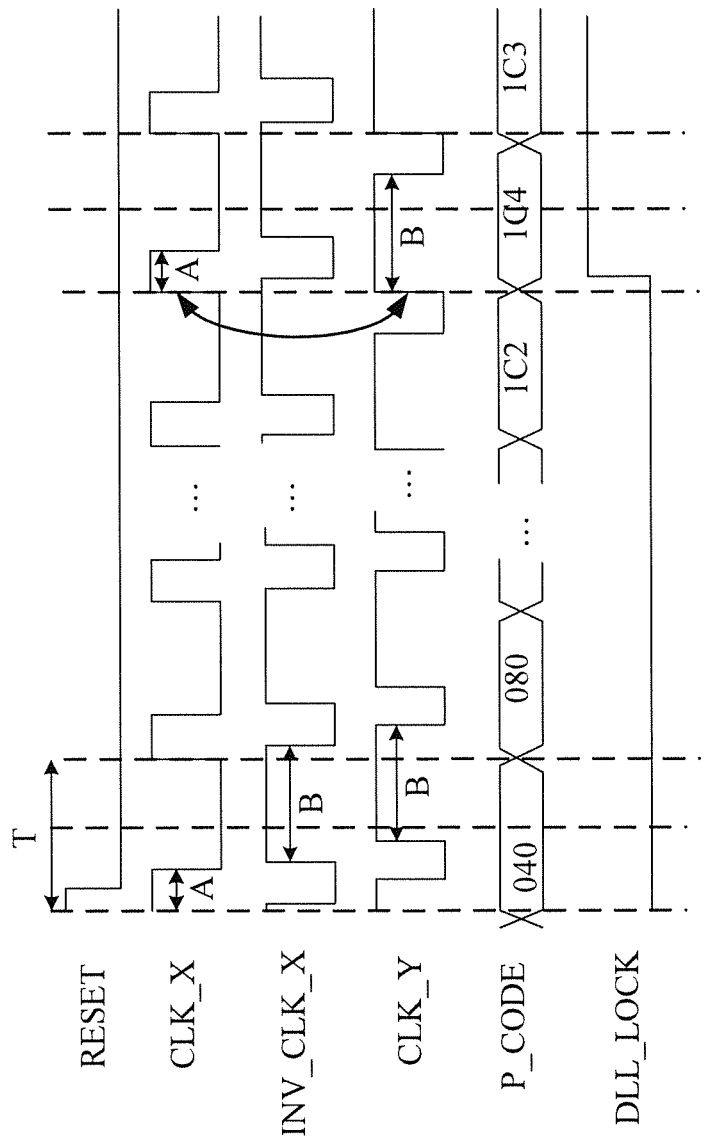
FIG. 2A and FIG. 2B show waveforms according to an embodiment of the present invention.
Figure 2B:
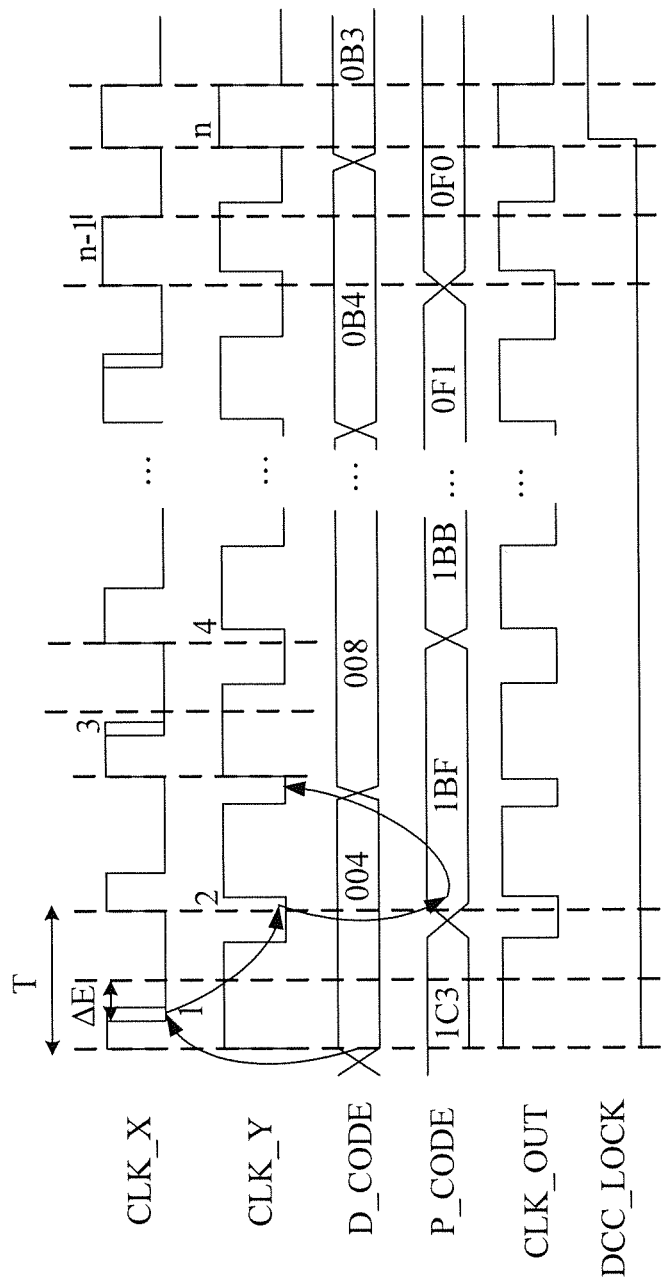

FIGS. 2A and 2B show waveforms according to an embodiment of the present invention. As shown in FIG. 2A, after system reset, the duty cycle select signal duty_select outputted by the duty cycle correcting module 14 is zero, namely, a low signal level. The phase select signal phase_select outputted by the phase-lock module 16 is also zero, a low signal level. The sampling unit 12 receives the input clock signal CLK_in and transmits it to the duty cycle correcting module 14, which, then, outputs the first clock signal CLK_X. Next, the first clock signal CLK_X is inverted and input to the phase-lock module 16, which outputs the second clock signal CLK_Y. The phase detecting unit 162 of the phase-lock module 16 detects the phase difference between the first and second clock signals CLK_X, CLK_Y and outputs the corresponding detecting signal P_det to the phase control unit 166. The phase control unit 166 produces the corresponding phase control code P_code according to the detecting signal P_det and transmits it to the phase tuning unit 164 for compensating the phase difference between the first and second clock signals CLK_X, CLK_Y. After the phase difference between the first and second clock signals CLK_X, CLK_Y is eliminated, the phase-lock module 16 is locked. After the phase-lock module 16 is locked, the positive edges of the first and second clock signals CLK_X, CLK_Y are aligned. Besides, because the first and second clock signals CLK_X, CLK_Y are complementary signals, when the period of the input clock signal CLK_in is T and initial pulse widths of the first and second clock signals CLK_X, CLK_Y are assumed to be A and B, their duty cycles will be (A/T) *100% and (B/T)*100%, respectively, where T=A+B.

As shown in FIG. 2B, after the phase-lock module 16 is locked, the duty cycle correcting module 14 starts to compensate the duty-cycle error of the output clock signal CLK_out, namely, adjusting the pulse width of the clock signal. The duty cycle detecting unit 142 of the duty cycle correcting module 14 detects the negative edges of the positive-edge-aligned first and second clock signals CLK_X, CLK_Y. In other words, as the phases of the positive edges of the first and second clock signals CLK_X, CLK_Y are aligned, the phases of the negative edges thereof are compared for giving the pulse-width difference between the first and second clock signals CLK_X, CLK_Y and producing the corresponding detect signal D_det and transmitting it to the duty cycle control unit 146. The duty cycle control unit 146 produces the corresponding duty cycle control code D_code according to the detect signal D_det and transmits it to the duty cycle tuning unit 144 for widening the pulse width of the first clock signal CLK_X. According to the present embodiment, it is assumed that the duty cycle of the input clock signal CLK_in is less than 50%. Nonetheless, the present invention is not limited to the embodiment.

Every time the duty cycle correcting module 14 widens the pulse width of the first clock signal CLK_X, then, at the next cycle, because the pulse width of the previous cycle is tuned, the phase of the positive edge of the second clock signal CLK_Y lags that of the first clock signal CLK_X. Thereby, at the second cycle, the phase control code P_code is adjusted for re-aligning the positive edges of the first and second clock signals CLK_X, CLK_Y. Accordingly, the phases of the positive and negative edges of the first and second clock signals CLK_X, CLK_Y are corrected repeatedly until the pulse widths of the first and second clock signals CLK_X, CLK_Y are identical. Then the duty cycle correcting module 14 is locked.

The pulse width of the first clock signal CLK_X increases by a shift value ΔE, which is equal to (B−A)/2. Because the period of the input clock signal is T, the pulse widths of the first and second clock signals CLK_X, CLK_Y, finally, become A+ΔE=A+(B−A)/2=(A+B)/2=T/2, which means that the duty cycles of the first and second clock signals CLK_X, CLK_Y are corrected to (T/2)/T*100%=50%.

Furthermore, when the duty cycle correcting module 14 is locked, the signal level of the phase select signal phase_select outputted by the phase-lock module is driven to high for switching the input signal of the phase detecting unit 162 of the phase-lock module 16 to the input clock signal CLK_in and the output clock signal CLK_out. Then, the phase-lock module 16 can further compensate the phase difference according to the input and output clock signals CLK_in, CLK_out for aligning the positive edges thereof.

After the phase-lock module 16 aligns the positive edges of the first and second clock signals CLK_X, CLK_Y for the first time, if the duty cycle correcting module 14 detects the pulse width of the first clock signal CLK_X greater than that of the second clock signal CLK_Y, namely, the duty cycle of the input clock signal CLK_in is greater than 50%, the signal level of the duty cycle select signal duty_select outputted by the duty cycle correcting module 14 is high for inverting the input clock signal CLK_in, and thus ensuring that the duty cycle of the input signal to the duty cycle tuning unit 144 is always less than 50%. At this moment, the output clock signal is changed to the inverted second clock signal CLK_Y.

Figure 3:
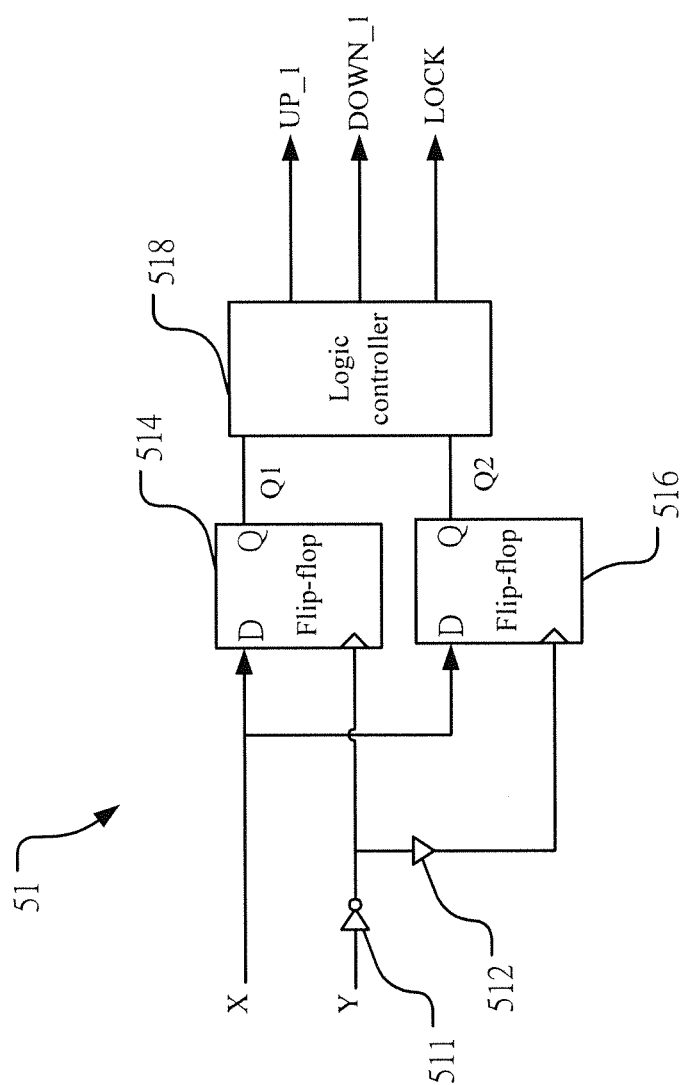
FIG. 3 shows a circuit diagram of the coarse-tuning phase detecting circuit according to the present invention.
Figure 4:
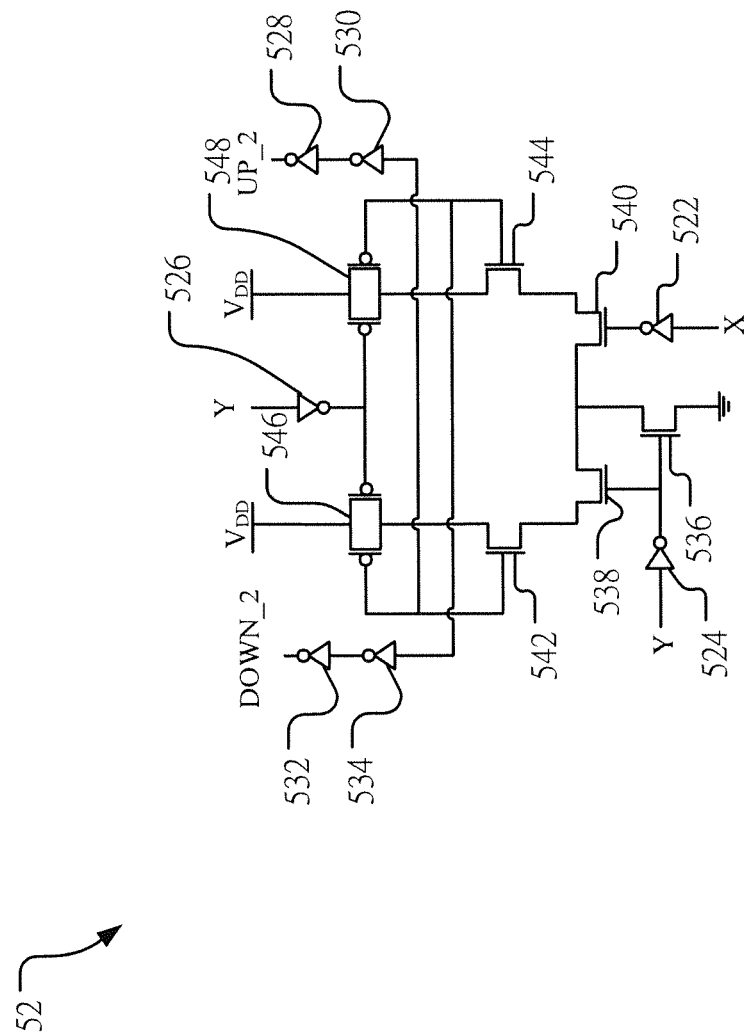
FIG. 4 shows a circuit diagram of the fine-tuning phase detecting circuit according to the present invention.

FIG. 3 and FIG. 4 show circuit diagram of phase detecting units according to the present invention. As shown in the figures, the phase detecting unit according to the present invention comprises a coarse-tuning phase detecting circuit 51 and a fine-tuning phase detecting circuit 52. The coarse-tuning phase detecting circuit 51 comprises an inverter 511, a buffer 512, a first flip-flop 514, a second flip-flop 516, and a logic controller 518; the fine-tuning phase detecting circuit 52 comprises a plurality of inverters 522, 524, 526, 528, 530, 532, 534, a plurality of transistors 536, 538, 540, 542, 544, a first transmission gate 546, and a second transmission gate 548.

The first and second flip-flops 514, 516 of the coarse-tuning phase detecting circuit 51 are D flip-flops. The buffer 512 is connected to the clock signal Y and the second flip-flop 516 via the inverter 511. The first flip-flop 514 is connected to the clock signal X, and to the clock signal Y via the inverter 511. Besides, the outputs Q1, Q2 of the first and second flip-flops 514, 516 are led to the logic controller 518 so that the logic controller 518 can output the detecting signals, such as phase-leading signal UP_1, phase-lagging signal DOWN_1, and phase-lock signal LOCK.

The inverter 522 of the fine-tuning phase detecting circuit 52 receives the clock signal X and is connected to the gate of the transistor 540. The inverter 524 receives the clock signal Y and is connected to the gates of the transistors 536, 538. The inverter 526 receives the clock signal Y and is connected to the first and second transmission gates 546, 548. The inverter 528 outputs the phase-leading signal UP_2. The inverter 530 is connected to the inverter 528, the gate of the transistor 542, and the first transmission gate 546. The inverter 532 outputs the phase-lagging signal DOWN_2. The inverter 534 is connected to the inverter 532, the gate of the transistor 544, and the second transmission gate 548. The transistor 536 is further coupled to the ground and the transistors 538, 540. The transistor 542 is further coupled to the transistor 538 and the first transmission gate 546. The transistor 544 is further connected to the transistor 540 and the second transmission gate 548. The first and second transmission gates 546, 548 are connected to a voltage source $V_{DD}$, respectively.

Moreover, when the phase difference between the clock signals X, Y is very large, the coarse-tuning phase detecting circuit 51 is used for judging the situation of phase leading and lagging. When the phase difference between the clock signals X, Y is smaller than the detectable range of the coarse-tuning phase detecting circuit 51, the fine-tuning phase detecting circuit 52 is used for detecting the extremely small phase difference between the clock signals X, Y.

The coarse-tuning and fine-tuning phase detecting circuits 51, 52 according to the embodiment described above are used as the duty cycle detecting unit 142 in FIG. 1. The coarse-tuning and fine-tuning phase detecting circuits 51, 52 described above detect the negative-edge phases for detecting the pulse widths of the first and second clock signals CLK_X, CLK_Y in FIG. 1. In addition, by eliminating the inverter 511 in the coarse-tuning phase detecting circuit 51 and the inverters 522, 524, 526 in the fine-tuning phase detecting circuit 52, they can be used as the phase detecting unit 162 in FIG. 1.

Figure 5:
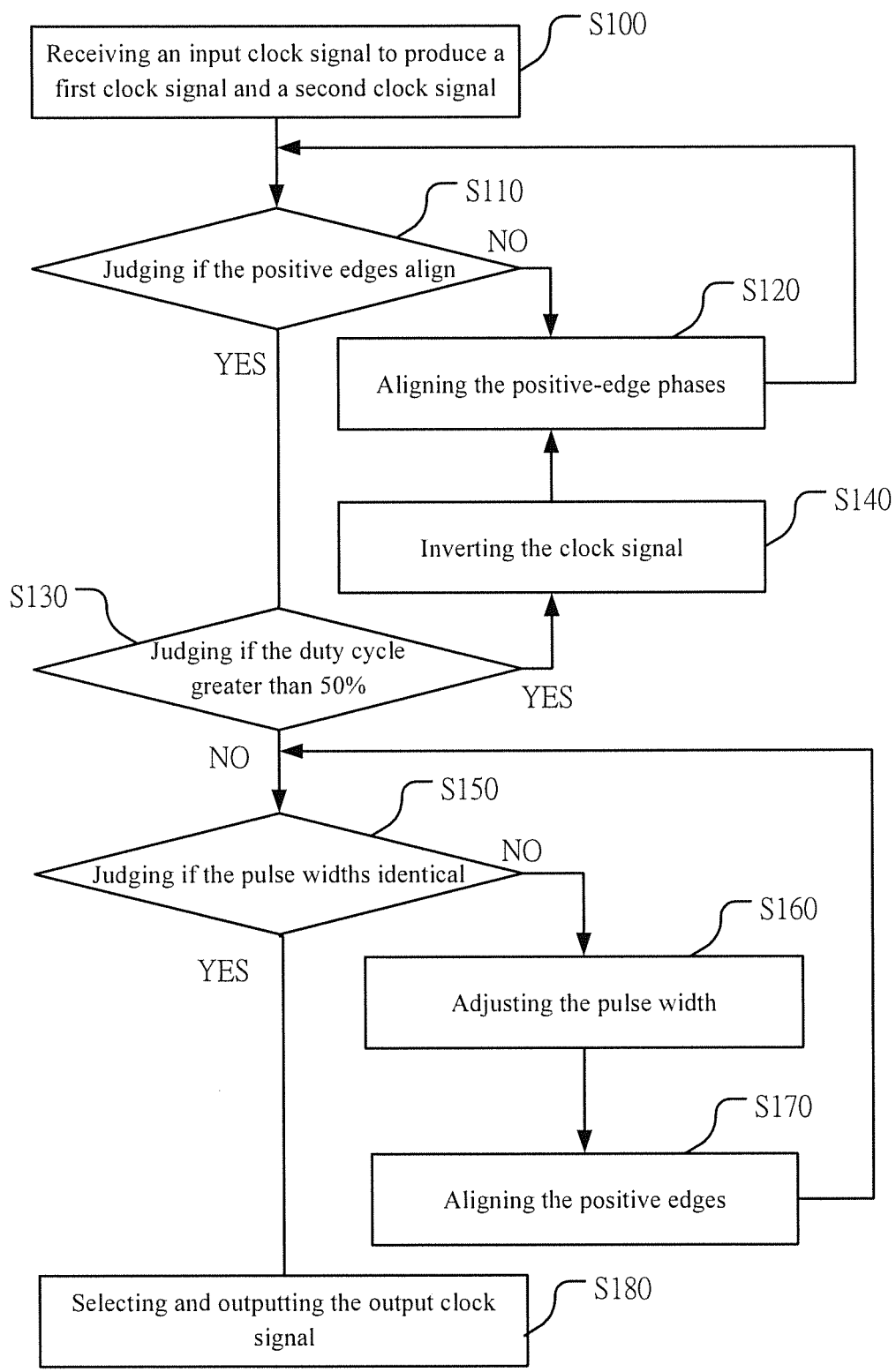
FIG. 5 shows a flowchart according an embodiment of the present invention.

FIG. 5 shows a flowchart according an embodiment of the present invention. As shown in the figure, the full-digital clock duty cycle correction method according to the present invention comprises steps of:

Step S100: Receiving an input clock signal for producing a first clock signal and a second clock signal correspondingly;

Step S110: Detecting the phase difference between the positive edges of the first and second clock signals for judging if the positive edges of the first and second clock signals is aligned;

Step S120: Aligning the positive-edge phases of the first and second clock signals according to the positive-edge phase difference;

Step S130: Judging if the duty cycle of the first clock signal is greater than 50%;

Step S140: Inverting the first clock signal;

Step S150: Comparing the pulse-width difference between the first and second clock signals for judging if the pulse widths of the first and second clock signals are identical;

Step S160: Adjusting the pulse width of the first clock signal according to the pulse-width difference;

Step S170: Detecting a positive-edge phase difference between the first and second clock signals and aligning the positive edges of the first and second clock signals according to the positive-edge difference; and Step S180: Selecting and outputting the output clock signal.

In the step S100, the sampling unit 12 receives an input clock signal and inputs it to the duty cycle correcting module 14 for producing a first clock signal correspondingly and inputting it to the phase-lock module 16, which, then, produces a second clock signal correspondingly. The second clock signal is the inverted first clock signal. In the step S110, the phase-lock module detects the phase difference between the first and second clock signals sampled by the sampling unit 12 for judging if the first and second clock signals are aligned. If the positive edges are not aligned, the step S120 is executed; if aligned, the step S130 is executed. In the step S120, the phase-lock module 16 compensates the measured phase difference between positive edges for aligning the positive edges of the first and second clock signals as well as delaying the positive edge of the second clock signal until the positive edges of the first and second clock signals are aligned. The description of the present embodiment is as shown in FIG. 2A.

In the step S130, the positive-edge-aligned first and second clock signals are received and transmitted to a duty cycle correcting module 14 for detecting the pulse widths of the first and second clock signals, which is used for judging if the duty cycle is greater than 50%. When the duty cycle of the first clock signal is greater than 50%, the step S140 is executed; otherwise, the step S150 is executed. In the step S140, because the duty cycle of the first clock signal is greater than 50%, the duty cycle correcting module 14 produces a duty cycle select signal duty_select correspondingly for controlling the sampling unit 12 to receive the inverted clock signals, namely, the inverted input clock signal CLK_in, the first clock signal CLK_X, and the second clock signal CLK_Y. Next, the step S120 is executed subsequently. In the step S150, the duty cycle correcting module 14 compares the difference of pulse widths between the first and second clock signals for judging if their pulse widths are equal. If their pulse widths are not equal, the step S160 is executed; otherwise, the step S180 is executed. In the step S170, after the pulse width of the first clock signal is adjusted, it is required to switch to the phase-lock module 16 for re-detecting the positive-edge phase difference between the first and second clock signals, and hence re-aligning the positive edges of the first and second clock signals. Then the step S150 is executed for re-judging if the pulse widths of the first and second clock signals are equal until they have identical pulse widths. In the step S180, after the phase-lock module 16 aligns the first and second clock signals having identical pulse widths, it controls the sampling unit 12 to select the second clock signal and the inverted second clock signal. By means of the duty cycle select signal duty_select, the sampling unit 12 is controlled to output the output clock signal.

Finally, the present invention provides a full-digital clock duty cycle correction circuit and a method thereof. The present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A full-digital clock duty cycle correction circuit, comprising:
    a sampling unit, receiving and sampling an input clock signal;
    a duty cycle correcting module, connected electrically to said sampling unit, and producing a first clock signal according to said input clock signal;
    a phase-lock module, connected electrically to said sampling unit and said duty cycle correcting module, inverting said first clock signal and producing a second clock signal, said sampling unit transmitting said first clock signal and said second clock signal to said phase-lock module, said phase-lock module detecting a positive-edge phase difference between said first clock signal and said second clock signal for aligning the positive edges of said first clock signal and said second clock signal, said sampling unit transmitting said positive-edge-aligned first clock signal and said positive-edge-aligned second clock signal to said duty cycle correcting module, said duty cycle correcting module comparing a pulse width difference between said first clock signal and said second clock signal for adjusting the pulse widths of said first clock signal and said second clock signal until the pulse widths are identical, and outputting said second clock signal as a third clock signal.

2. The full-digital clock duty cycle correction circuit of claim 1, wherein said phase-lock module comprises:
    a phase detecting unit, detecting the positive-edge phase difference between said first clock signal and said second clock signal to produce a phase detecting signal;
    a phase tuning unit, receiving said first clock signal and said second clock signal; and a phase control unit, connected electrically to said phase tuning unit and said phase detecting unit, producing a phase control code according to said phase detecting signal and transmitting said phase control code to said phase tuning unit for driving said phase tuning unit to aligning the positive edges of said first clock signal and said second clock signal, and said phase control unit locking said phase tuning unit after aligning the phases of said first clock signal and said second clock signal.

3. The full-digital clock duty cycle correction circuit of claim 1, wherein said duty cycle correcting module comprises:

a duty cycle detecting unit, producing a duty cycle detecting signal according to the pulse-width difference between said first clock signal and said second clock signal;

a duty cycle tuning unit, receiving said first clock signal and said second clock signal; and a duty cycle control unit, connected electrically to said duty cycle detecting unit, producing a duty cycle control code according to said duty cycle detecting signal and transmitting said duty cycle control code to said duty cycle correcting unit for adjusting the pulse widths of said first clock signal and said second clock signal, and said duty cycle control unit locking said duty cycle correcting unit after adjusting the duty cycle of said first clock signal and said second clock signal.

4. A full-digital clock duty cycle correction method, comprising steps of:

receiving an input clock signal, and sampling for producing a first clock signal;

inverting said first clock signal and giving a second clock signal;

transmitting said first clock signal and said second clock signal to a phase-lock module for detecting a positive-edge phase difference between said first clock signal and said second clock signal, and aligning the positive edges of said first clock signal and said second clock signal according to the positive-edge phase difference;

transmitting said positive-edge-aligned first clock signal and said positive-edge-aligned second clock signal to a duty cycle correcting module, and comparing the pulse-width difference between said first clock signal and said second clock signal for adjusting the pulse widths of said first clock signal and said second clock signal;

and comparing and outputting said second clock signal as a full-digital clock signal having 50% duty cycle when the pulse-width difference between said first clock signal and said second clock signal is zero.

5. The full-digital clock duty cycle correction method of claim 4, wherein said step of detecting the positive-edge phase difference between said first clock signal and said second clock signal is detecting the positive-edge phase difference to produces a phase detecting signal.

6. The full-digital clock duty cycle correction method of claim 5, wherein said step of aligning the positive edges of said first clock signal and said second clock signal according to the positive-edge phase difference is producing a phase control code according to said phase detecting signal and transmitting said phase control code to said phase-lock module for compensating the positive-edge phase difference.

7. The full-digital clock duty cycle correction method of claim 4, wherein said step of comparing the pulse-width difference between said first clock signal and said second clock signal is producing a duty cycle detecting signal according to the pulse-width difference between said first clock signal and said second clock signal.

8. The full-digital clock duty cycle correction method of claim 7, wherein said step of adjusting the pulse widths of said first clock signal and second clock signal is producing a duty cycle control code according to the duty cycle detecting signal and transmitting said duty cycle control code to said duty cycle correcting module for adjusting the pulse widths of said first clock signal and second clock signal.

* * * * *